(12) United States Patent
Goodwin

(10) Patent No.: US 7,606,040 B2
(45) Date of Patent: Oct. 20, 2009

(54) MEMORY MODULE SYSTEM AND METHOD

(75) Inventor: Paul Goodwin, Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 351 days.

(21) Appl. No.: 11/077,952

(22) Filed: Mar. 11, 2005

(65) Prior Publication Data

US 2006/0203442 A1 Sep. 14, 2006
US 2008/0278901 A9 Nov. 13, 2008

Related U.S. Application Data

(63) Continuation-in-part of application No. 10/934,027, filed on Sep. 3, 2004, and a continuation-in-part of application No. 11/005,992, filed on Dec. 7, 2004, and a continuation-in-part of application No. 11/007,551, filed on Dec. 8, 2004.

(51) Int. Cl.
*H05K 7/02* (2006.01)
(52) U.S. Cl. .................. 361/749; 361/736; 361/760; 174/254; 257/723
(58) Field of Classification Search .................. 361/749, 361/760, 736, 748, 764; 174/254; 257/723
See application file for complete search history.

(56) References Cited

U.S. PATENT DOCUMENTS

| | | |
|---|---|---|
| 3,372,310 A | 3/1968 | Kantor |
| 3,436,604 A | 4/1969 | Hyltin |
| 3,582,865 A | 6/1971 | Franck et al. |
| 3,654,394 A | 4/1972 | Gordon |
| 3,704,455 A | 11/1972 | Scarbrough |
| 3,718,842 A | 2/1973 | Abboti, III et al. |
| 3,727,064 A | 4/1973 | Bottini |
| 3,746,934 A | 7/1973 | Stein |
| 3,766,439 A | 10/1973 | Isaacson |

(Continued)

FOREIGN PATENT DOCUMENTS

EP 122-687 (A) 10/1984

(Continued)

OTHER PUBLICATIONS pp. 19-22 of Presentation by Netlist, Aug. 2004.

(Continued)

*Primary Examiner*—Dameon E Levi
(74) *Attorney, Agent, or Firm*—Fish & Richardson P.C.

(57) ABSTRACT

Memory module flex circuitry is devised to accommodate packaged integrated circuit devices (ICs) of varying heights or thicknesses. The invention may be employed to advantage in a variety of modules that employ flex circuitry including, but not limited to, fully-buffered, registered or more simple memory modules. Many such modules may replace conventionally-constructed DIMMs without change to the system in which the module is employed. Regions of the flex circuitry devised to provide one or more mounting locales for ICs are delineated, in part, from the main body of the flex circuit. The delineation may be implemented in a preferred embodiment by separating a designated IC mounting area or peninsula from the main body of the flex circuitry either with isolating areas or separations or with tabs that extend from the primary perimeter of the flex circuitry.

9 Claims, 6 Drawing Sheets

U.S. PATENT DOCUMENTS

| | | |
|---|---|---|
| 3,772,776 A | 11/1973 | Weisenburger |
| 4,169,642 A | 10/1979 | Mouissie |
| 4,288,841 A | 9/1981 | Gogal |
| 4,342,069 A | 7/1982 | Link |
| 4,429,349 A | 1/1984 | Zachry |
| 4,437,235 A | 3/1984 | McIver |
| 4,513,368 A | 4/1985 | Houseman |
| 4,547,834 A | 10/1985 | Dumont et al. |
| 4,567,543 A | 1/1986 | Miniet |
| 4,587,596 A | 5/1986 | Bunnell |
| 4,645,944 A | 2/1987 | Uya |
| 4,656,605 A | 4/1987 | Clayton |
| 4,672,421 A | 6/1987 | Lin |
| 4,682,207 A | 7/1987 | Akasaki et al. |
| 4,696,525 A | 9/1987 | Coller et al. |
| 4,709,300 A | 11/1987 | Landis |
| 4,724,611 A | 2/1988 | Hagihara |
| 4,727,513 A | 2/1988 | Clayton |
| 4,733,461 A | 3/1988 | Nakano |
| 4,739,589 A | 4/1988 | Brehm et al. |
| 4,763,188 A | 8/1988 | Johnson |
| 4,771,366 A | 9/1988 | Blake et al. |
| 4,821,007 A | 4/1989 | Fields et al. |
| 4,823,234 A | 4/1989 | Konishi et al. |
| 4,833,568 A | 5/1989 | Berhold |
| 4,850,892 A | 7/1989 | Clayton et al. |
| 4,862,249 A | 8/1989 | Carlson |
| 4,911,643 A | 3/1990 | Perry et al. |
| 4,953,060 A | 8/1990 | Lauffer et al. |
| 4,956,694 A | 9/1990 | Eide |
| 4,972,580 A | 11/1990 | Nakamura |
| 4,982,265 A | 1/1991 | Watanabe et al. |
| 4,983,533 A | 1/1991 | Go |
| 4,985,703 A | 1/1991 | Kaneyama |
| 4,992,849 A | 2/1991 | Corbett et al. |
| 4,992,850 A | 2/1991 | Corbett et al. |
| 5,014,115 A | 5/1991 | Moser |
| 5,014,161 A | 5/1991 | Lee et al. |
| 5,016,138 A | 5/1991 | Woodman |
| 5,025,306 A | 6/1991 | Johnson et al. |
| 5,034,350 A | 7/1991 | Marchisi |
| 5,041,015 A | 8/1991 | Travis |
| 5,053,853 A | 10/1991 | Haj-Ali-Ahmadi et al. |
| 5,065,277 A | 11/1991 | Davidson |
| 5,099,393 A | 3/1992 | Bentlage et al. |
| 5,104,820 A | 4/1992 | Go et al. |
| 5,109,318 A | 4/1992 | Funari et al. |
| 5,117,282 A | 5/1992 | Salatino |
| 5,119,269 A | 6/1992 | Nakayama |
| 5,138,430 A | 8/1992 | Gow, 3rd et al. |
| 5,138,434 A | 8/1992 | Wood et al. |
| 5,140,405 A | 8/1992 | King et al. |
| 5,159,535 A | 10/1992 | Desai et al. |
| 5,173,840 A | 12/1992 | Kodai et al. |
| 5,191,404 A | 3/1993 | Wu et al. |
| 5,208,729 A | 5/1993 | Cipolla et al. |
| 5,214,845 A | 6/1993 | King et al. |
| 5,219,377 A | 6/1993 | Poradish |
| 5,222,014 A | 6/1993 | Lin |
| 5,224,023 A | 6/1993 | Smith et al. |
| 5,229,916 A | 7/1993 | Frankeny et al. |
| 5,229,917 A | 7/1993 | Harris et al. |
| 5,239,198 A | 8/1993 | Lin et al. |
| 5,241,454 A | 8/1993 | Ameen et al. |
| 5,241,456 A | 8/1993 | Marcinkiewicz et al. |
| 5,247,423 A | 9/1993 | Lin et al. |
| 5,252,857 A | 10/1993 | Kane et al. |
| 5,259,770 A | 11/1993 | Bates et al. |
| 5,261,068 A | 11/1993 | Gaskins et al. |
| 5,268,815 A | 12/1993 | Cipolla et al. |
| 5,276,418 A | 1/1994 | Klosowiak et al. |
| 5,281,852 A | 1/1994 | Normington |
| 5,285,398 A | 2/1994 | Janik et al. |
| 5,289,062 A | 2/1994 | Wyland |
| 5,309,986 A | 5/1994 | Itoh |
| 5,313,097 A | 5/1994 | Haj-Ali-Ahmadi et al. |
| 5,347,428 A | 9/1994 | Carson et al. |
| 5,362,656 A | 11/1994 | McMahon |
| 5,375,041 A | 12/1994 | McMahon |
| 5,386,341 A | 1/1995 | Olson et al. |
| 5,394,300 A | 2/1995 | Yoshimura |
| 5,397,916 A | 3/1995 | Normington |
| 5,400,003 A | 3/1995 | Kledzik |
| 5,428,190 A | 6/1995 | Stopperan |
| 5,438,224 A | 8/1995 | Papageorge et al. |
| 5,448,511 A | 9/1995 | Paurus et al. |
| 5,477,082 A | 12/1995 | Buckley, III et al. |
| 5,491,612 A | 2/1996 | Nicewarner, Jr. et al. |
| 5,502,333 A | 3/1996 | Bertin et al. |
| 5,523,619 A | 6/1996 | McAllister et al. |
| 5,523,695 A | 6/1996 | Lin |
| 5,541,812 A | 7/1996 | Burns |
| 5,572,065 A | 11/1996 | Burns |
| 5,600,178 A | 2/1997 | Russell |
| 5,612,570 A | 3/1997 | Eide et al. |
| 5,631,193 A | 5/1997 | Burns |
| 5,642,055 A | 6/1997 | Difrancesco |
| 5,644,161 A | 7/1997 | Burns |
| 5,646,446 A | 7/1997 | Nicewarner et al. |
| 5,654,877 A | 8/1997 | Burns |
| 5,661,339 A | 8/1997 | Clayton |
| 5,686,730 A | 11/1997 | Laudon et al. |
| 5,688,606 A | 11/1997 | Mahulikar et al. |
| 5,708,297 A | 1/1998 | Clayton |
| 5,714,802 A | 2/1998 | Cloud et al. |
| 5,717,556 A | 2/1998 | Yanagida |
| 5,729,894 A | 3/1998 | Rostoker et al. |
| 5,731,633 A | 3/1998 | Clayton |
| 5,744,862 A | 4/1998 | Ishii |
| 5,751,553 A | 5/1998 | Clayton |
| 5,754,409 A | 5/1998 | Smith |
| 5,764,497 A | 6/1998 | Mizumo |
| 5,776,797 A | 7/1998 | Nicewarner, Jr. et al. |
| 5,777,275 A * | 7/1998 | Mizutani et al. ............ 174/254 |
| 5,789,815 A | 8/1998 | Tessier et al. |
| 5,790,447 A | 8/1998 | Laudon et al. |
| 5,802,395 A | 9/1998 | Connolly et al. |
| 5,805,422 A | 9/1998 | Otake et al. |
| 5,828,125 A | 10/1998 | Burns |
| 5,835,988 A | 11/1998 | Ishii |
| 5,869,353 A | 2/1999 | Levy et al. |
| 5,899,705 A | 5/1999 | Akram |
| 5,917,709 A | 6/1999 | Johnson et al. |
| 5,925,934 A | 7/1999 | Lim |
| 5,926,369 A | 7/1999 | Ingraham et al. |
| 5,949,657 A | 9/1999 | Karabatsos |
| 5,953,214 A | 9/1999 | Dranchak et al. |
| 5,953,215 A | 9/1999 | Karabatsos |
| 5,959,839 A | 9/1999 | Gates |
| 5,963,427 A | 10/1999 | Bollesen |
| 5,973,395 A | 10/1999 | Suzuki et al. |
| 5,995,370 A | 11/1999 | Nakamori |
| 6,002,167 A | 12/1999 | Hatano et al. |
| 6,002,589 A | 12/1999 | Perino et al. |
| 6,008,538 A | 12/1999 | Akram et al. |
| 6,014,316 A | 1/2000 | Eide |
| 6,021,048 A | 2/2000 | Smith |
| 6,025,992 A | 2/2000 | Dodge et al. |
| 6,028,352 A | 2/2000 | Eide |
| 6,028,365 A | 2/2000 | Akram et al. |
| 6,034,878 A | 3/2000 | Osaka et al. |
| 6,038,132 A | 3/2000 | Tokunaga et al. |
| 6,040,624 A | 3/2000 | Chambers et al. |
| 6,049,975 A | 4/2000 | Clayton |

| | | | | | | |
|---|---|---|---|---|---|---|
| 6,060,339 | A | 5/2000 | Akram et al. | 6,544,815 B2 | 4/2003 | Isaak |
| 6,072,233 | A | 6/2000 | Corisis et al. | 6,552,910 B1 | 4/2003 | Moon et al. |
| 6,078,515 | A | 6/2000 | Nielsen et al. | 6,552,948 B2 | 4/2003 | Woo et al. |
| 6,084,294 | A | 7/2000 | Tomita | 6,560,117 B2 | 5/2003 | Moon |
| 6,091,145 | A | 7/2000 | Clayton | 6,566,746 B2 | 5/2003 | Isaak et al. |
| 6,097,087 | A | 8/2000 | Farnworth et al. | 6,572,387 B2 | 6/2003 | Burns et al. |
| 6,111,757 | A | 8/2000 | Dell et al. | 6,573,593 B1 | 6/2003 | Syri et al. |
| 6,121,676 | A | 9/2000 | Solberg | 6,576,992 B1 | 6/2003 | Cady et al. |
| RE36,916 | E | 10/2000 | Moshayedi | 6,588,095 B1 | 7/2003 | Pan |
| 6,157,541 | A | 12/2000 | Hacke | 6,590,282 B1 | 7/2003 | Wang et al. |
| 6,172,874 | B1 | 1/2001 | Bartilson | 6,600,222 B1 | 7/2003 | Levardo |
| 6,178,093 | B1 | 1/2001 | Bhatt et al. | 6,614,664 B2 | 9/2003 | Lee |
| 6,180,881 | B1 | 1/2001 | Isaak | 6,627,984 B2 | 9/2003 | Bruce et al. |
| 6,187,652 | B1 | 2/2001 | Chou et al. | 6,629,855 B1 | 10/2003 | North et al. |
| 6,205,654 | B1 | 3/2001 | Burns | 6,646,936 B2 | 11/2003 | Hamamatsu et al. |
| 6,208,521 | B1 | 3/2001 | Nakatsuka | 6,660,561 B2 | 12/2003 | Forthun et al. |
| 6,208,546 | B1 | 3/2001 | Ikeda | 6,661,092 B2 | 12/2003 | Shibata et al. |
| 6,214,641 | B1 | 4/2001 | Akram | 6,677,670 B2 | 1/2004 | Kondo |
| 6,215,181 | B1 | 4/2001 | Akram et al. | 6,683,377 B1 | 1/2004 | Shim et al. |
| 6,215,687 | B1 | 4/2001 | Sugano et al. | 6,690,584 B2 | 2/2004 | Uzuka et al. |
| 6,222,737 | B1 | 4/2001 | Ross | 6,699,730 B2 | 3/2004 | Kim et al. |
| 6,222,739 | B1 | 4/2001 | Bhakta et al. | 6,720,652 B2 | 4/2004 | Akram et al. |
| 6,225,688 | B1 | 5/2001 | Kim et al. | 6,721,181 B1 | 4/2004 | Pfeifer et al. |
| 6,232,659 | B1 | 5/2001 | Clayton | 6,721,185 B2 | 4/2004 | Dong et al. |
| 6,233,650 | B1 | 5/2001 | Johnson et al. | 6,721,226 B2 | 4/2004 | Woo et al. |
| 6,234,820 | B1 | 5/2001 | Perino et al. | 6,744,656 B2 | 6/2004 | Sugano et al. |
| 6,262,476 | B1 | 7/2001 | Vidal | 6,751,113 B2 | 6/2004 | Bhakta et al. |
| 6,262,895 | B1 | 7/2001 | Forthun | 6,756,661 B2 | 6/2004 | Tsuneda et al. |
| 6,265,660 | B1 | 7/2001 | Tandy | 6,760,220 B2 | 7/2004 | Canter et al. |
| 6,266,252 | B1 | 7/2001 | Karabatsos | 6,762,942 B1 | 7/2004 | Smith |
| 6,281,577 | B1 | 8/2001 | Oppermann et al. | 6,768,660 B2 | 7/2004 | Kong et al. |
| 6,288,907 | B1 | 9/2001 | Burns | 6,833,981 B2 | 12/2004 | Suwabe et al. |
| 6,288,924 | B1 | 9/2001 | Sugano et al. | 6,833,984 B1 * | 12/2004 | Belgacem .................... 361/58 |
| 6,300,679 | B1 | 10/2001 | Mukerji et al. | 6,839,266 B1 | 1/2005 | Garrett, Jr. et al. |
| 6,307,751 | B1 * | 10/2001 | Bodony et al. ............... 361/749 | 6,841,868 B2 | 1/2005 | Akram et al. |
| 6,316,825 | B1 | 11/2001 | Park et al. | 6,850,414 B2 | 2/2005 | Benisek et al. |
| 6,323,060 | B1 | 11/2001 | Isaak | 6,873,534 B2 | 3/2005 | Bhakta et al. |
| 6,336,262 | B1 | 1/2002 | Dalal et al. | 6,878,571 B2 | 4/2005 | Isaak et al. |
| 6,343,020 | B1 | 1/2002 | Lin et al. | 6,884,653 B2 | 4/2005 | Larson |
| 6,347,394 | B1 | 2/2002 | Ochoa et al. | 6,914,324 B2 | 7/2005 | Rapport et al. |
| 6,349,050 | B1 | 2/2002 | Woo et al. | 6,919,626 B2 | 7/2005 | Burns |
| 6,351,029 | B1 | 2/2002 | Isaak | 6,956,284 B2 | 10/2005 | Cady et al. |
| 6,357,023 | B1 | 3/2002 | Co et al. | 7,053,478 B2 | 5/2006 | Roper et al. |
| 6,358,772 | B2 | 3/2002 | Miyoshi | 7,094,632 B2 | 8/2006 | Cady et al. |
| 6,360,433 | B1 | 3/2002 | Ross | 7,180,167 B2 | 2/2007 | Partridge et al. |
| 6,368,896 | B2 | 4/2002 | Farnworth et al. | 7,393,226 B2 | 7/2008 | Clayton et al. |
| 6,370,668 | B1 | 4/2002 | Garrett, Jr. et al. | 7,394,149 B2 * | 7/2008 | Clayton et al. ............. 257/686 |
| 6,376,769 | B1 | 4/2002 | Chung | 7,511,968 B2 * | 3/2009 | Goodwin ..................... 361/803 |
| 6,392,162 | B1 | 5/2002 | Karabatsos | 7,522,425 B2 * | 4/2009 | Goodwin ..................... 361/749 |
| 6,404,043 | B1 | 6/2002 | Isaak | 7,542,297 B2 * | 6/2009 | Wehrly et al. ............... 361/749 |
| 6,410,857 | B1 | 6/2002 | Gonya | 2001/0001085 A1 | 5/2001 | Hassanzadeh et al. |
| 6,426,240 | B2 | 7/2002 | Isaak | 2001/0006252 A1 | 7/2001 | Kim et al. |
| 6,426,549 | B1 | 7/2002 | Isaak | 2001/0013423 A1 | 8/2001 | Dalal et al. |
| 6,426,560 | B1 | 7/2002 | Kawamura et al. | 2001/0015487 A1 | 8/2001 | Forthun |
| 6,428,360 | B2 | 8/2002 | Hassanzadeh et al. | 2001/0026009 A1 | 10/2001 | Tsunesa et al. |
| 6,433,418 | B1 | 8/2002 | Fujisawa et al. | 2001/0028588 A1 | 10/2001 | Yamada et al. |
| 6,444,921 | B1 | 9/2002 | Wang et al. | 2001/0035572 A1 | 11/2001 | Isaak |
| 6,446,158 | B1 | 9/2002 | Karabatsos | 2001/0040793 A1 | 11/2001 | Inaba |
| 6,449,159 | B1 * | 9/2002 | Haba .......................... 361/707 | 2001/0052637 A1 | 12/2001 | Akram et al. |
| 6,452,826 | B1 | 9/2002 | Kim et al. | 2002/0001216 A1 | 1/2002 | Sugano et al. |
| 6,459,152 | B1 | 10/2002 | Tomita et al. | 2002/0006032 A1 | 1/2002 | Karabatsos |
| 6,462,412 | B2 | 10/2002 | Kamei et al. | 2002/0030995 A1 | 3/2002 | Shoji |
| 6,465,877 | B1 | 10/2002 | Farnworth et al. | 2002/0076919 A1 | 6/2002 | Peters et al. |
| 6,465,893 | B1 | 10/2002 | Khandros et al. | 2002/0094603 A1 | 7/2002 | Isaak |
| 6,472,735 | B2 | 10/2002 | Isaak | 2002/0101261 A1 | 8/2002 | Karabatsos |
| 6,473,308 | B2 | 10/2002 | Forthun | 2002/0139577 A1 | 10/2002 | Miller |
| 6,486,544 | B1 | 11/2002 | Hashimoto | 2002/0164838 A1 | 11/2002 | Moon et al. |
| 6,489,687 | B1 | 12/2002 | Hashimoto | 2002/0180022 A1 | 12/2002 | Emoto |
| 6,502,161 | B1 | 12/2002 | Perego et al. | 2002/0185731 A1 | 12/2002 | Akram et al. |
| 6,514,793 | B2 | 2/2003 | Isaak | 2002/0196612 A1 | 12/2002 | Gall et al. |
| 6,521,984 | B2 | 2/2003 | Matsuura | 2003/0002262 A1 | 1/2003 | Benisek et al. |
| 6,528,870 | B2 | 3/2003 | Fukatsu et al. | 2003/0026155 A1 | 2/2003 | Yamagata |
| 6,531,772 | B2 | 3/2003 | Akram et al. | 2003/0035328 A1 | 2/2003 | Hamamatsu et al. |

| | | | |
|---|---|---|---|
| 2003/0045025 A1 | 3/2003 | Coyle et al. | |
| 2003/0049886 A1 | 3/2003 | Salmon | |
| 2003/0064548 A1 | 4/2003 | Isaak | |
| 2003/0081387 A1 | 5/2003 | Schulz | |
| 2003/0081392 A1 | 5/2003 | Cady et al. | |
| 2003/0089978 A1 | 5/2003 | Miyamoto et al. | |
| 2003/0090879 A1 | 5/2003 | Doblar et al. | |
| 2003/0096497 A1 | 5/2003 | Moore et al. | |
| 2003/0109078 A1 | 6/2003 | Takahashi et al. | |
| 2003/0116835 A1 | 6/2003 | Miyamoto et al. | |
| 2003/0159278 A1 | 8/2003 | Peddle | |
| 2003/0168725 A1 | 9/2003 | Warner et al. | |
| 2004/0000708 A1 | 1/2004 | Rapport et al. | |
| 2004/0012991 A1 | 1/2004 | Kozaru | |
| 2004/0021211 A1 | 2/2004 | Damberg | |
| 2004/0099938 A1 | 5/2004 | Kang et al. | |
| 2004/0150107 A1 | 8/2004 | Cha et al. | |
| 2004/0229402 A1 | 11/2004 | Cady et al. | |
| 2004/0236877 A1 | 11/2004 | Burton | |
| 2005/0082663 A1 | 4/2005 | Wakiyama et al. | |
| 2005/0108468 A1 | 5/2005 | Hazelzet et al. | |
| 2005/0133897 A1 | 6/2005 | Baek et al. | |
| 2005/0242423 A1 | 11/2005 | Partridge et al. | |
| 2005/0263911 A1 | 12/2005 | Igarashi et al. | |
| 2006/0020740 A1 | 1/2006 | Bartley et al. | |
| 2006/0050496 A1 | 3/2006 | Goodwin | |
| 2006/0050497 A1 | 3/2006 | Goodwin | |
| 2006/0053345 A1 | 3/2006 | Goodwin | |
| 2006/0091529 A1 | 5/2006 | Wehrly et al. | |
| 2006/0095592 A1 | 5/2006 | Borkenhagen | |
| 2006/0111866 A1 | 5/2006 | LeClerg et al. | |
| 2006/0125067 A1 | 6/2006 | Wehrly et al. | |
| 2007/0211426 A1 | 9/2007 | Clayton et al. | |
| 2007/0211711 A1 | 9/2007 | Clayton | |
| 2007/0212906 A1 | 9/2007 | Clayton et al. | |
| 2007/0212920 A1 | 9/2007 | Clayton et al. | |
| 2008/0192428 A1 | 8/2008 | Clayton et al. | |

FOREIGN PATENT DOCUMENTS

| | | |
|---|---|---|
| EP | 0 298 211 A3 | 1/1989 |
| EP | 1 119049 A2 | 7/2001 |
| GB | 2 130 025 A | 5/1984 |
| JP | 53-85159 | 7/1978 |
| JP | 58-96756 (A) | 6/1983 |
| JP | 3-102862 | 4/1991 |
| JP | 5-29534 (A) | 2/1993 |
| JP | 5-335695 (A) | 12/1993 |
| JP | 2821315 (B2) | 11/1998 |
| JP | 2001/077294 (A) | 3/2001 |
| JP | 2001/085592 (A) | 3/2001 |
| JP | 2001/332683 (A) | 11/2001 |
| JP | 2002/009231 (A) | 1/2002 |
| JP | 2003/037246 (A) | 2/2003 |
| JP | 2003/086760 (A) | 3/2003 |
| JP | 2003/086761 (A) | 3/2003 |
| JP | 2003/309246 (A) | 10/2003 |
| JP | 2003/347503 (A) | 12/2003 |
| WO | WO03/037053 | 5/2003 |
| WO | WO 2003/037053 A1 | 5/2003 |
| WO | WO 2004/109802 A1 | 12/2004 |

OTHER PUBLICATIONS

Flexible Printed Circuit Technology—A Versatile Interconnection Option. (Website 2 pages) Fjelstad, Joseph. Dec. 3, 2002.
Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.
Tessera uZ Ball Stack Package. 4 figures that purport to be directed to the uZ—Ball Stacked Memory, Published on the Internet.
Chip Scale Review Online—An Independent Journal Dedicated to the Advancement of Chip-Scale Electronics. (Website 9 pages) Fjelstad, Joseph, Pacific Consultants L.LC., Published Jan. 2001 on Internet.
Flexible Thinking: Examining the Flexible Circuit Tapes. (Website 2 pages) Fjelstad, Joseph., Published Apr. 20, 2000 on Internet.
Ron Bauer, Intel. "Stacked-CSP Delivers Flexibility, Reliability, and Space-Saving Capabilities", vol. 3, Spring 2002. Published on the Internet.
Tessera Technologies, Inc.—Semiconductor Intellectual Property, Chip Scale Packaging—Website pp. (3), Internet.
Tessera Introduces uZ ä—Ball Stacked Memory Package for Computing and Portable Electronic Products Joyce Smaragdis, Tessera Public Relations, Sandy Skees, MCA PR (www.tessera.com/news_events/press_coverage.cfm); 2 figures that purport to be directed to the uZ ä—Ball Stacked Memory Package. Published Jul. 17, 2002 in San Jose, CA.
William R. Newberry, Design Techniques for Ball Grid Arrays, Xynetix Design Systems, Inc., Portland, Maine, Published on the Internet.
Chip Scale Packaging and Redistribution, Paul A. Magill, Glenn A. Rinne, J. Daniel Mis, Wayne C. Machon, Joseph W. Baggs, Unitive Electronics Inc.
Dense-Pac Microsystems, 16 Megabit High Speed CMOS SRAM DPS1MX16MKn3.
Dense-Pac Microsystems, 256 Megabyte CMOS DRAM DP3ED32MS72RW5.
Dense-Pac Microsystems, Breaking Space Barriers, 3-D Technology 1993.
Dense-Pac Microsystems, DPS512X16A3, Ceramic 512K X 16 CMOS SRAM Module.
IBM Preliminary 168 Pin SDRAM Registered DIMM Functional Description & Timing Diagrams.
3D Interconnection for Ultra-Dense Multichip Modules, Christian Val, Thomson-CSF DCS Computer Division, Thierry Lemoine, Thomson-CSF RCM Radar Countermeasures Division.
High Density Memory Packaging Technology High Speed Imaging Applications, Dean Frew, Texas Instruments Incorporated.
Vertically-Intergrated Package, Alvin Weinberg, Pacesetter, Inc. And W. Kinzy Jones, Florida International University.
PCT/US05/28547 International Search Report and Written Opinion, PCT, Aug. 18, 2006.
PCT/US05/28547 Notification Concerning Transmittal of Copy of International Preliminary Report on Patentability, Mar. 15, 2007.
GB 0516622.8 Search Report, May 25 2006.
PCT/US06/04690 International Search Report, PCT, Feb. 16, 2007.
PCT/US06/38720 International Search Report and Written Opinion, PCT, Apr. 5, 2007.
U.S. Appl. No. 11/306,803, filed Jan. 11, 2006, Chris Karabatsos (Applicant).
Complaint filed Mar. 8, 2007, in the United States District Court for the District of Massachusetts, Boston Division, Civil Action No. 07 CA 10468 DPW.
Letter dated Sep. 11, 2006, from Chris Karabatsos of Kentron Technologies to John Kelly, President of JEDEC Solid State Technology Association, concerning potential interferences involving U.S. Appl. No. 11/306,803.
PCT/US06/007193, International Search Report and Written Opinion, PCT, Nov. 7, 2007.

* cited by examiner

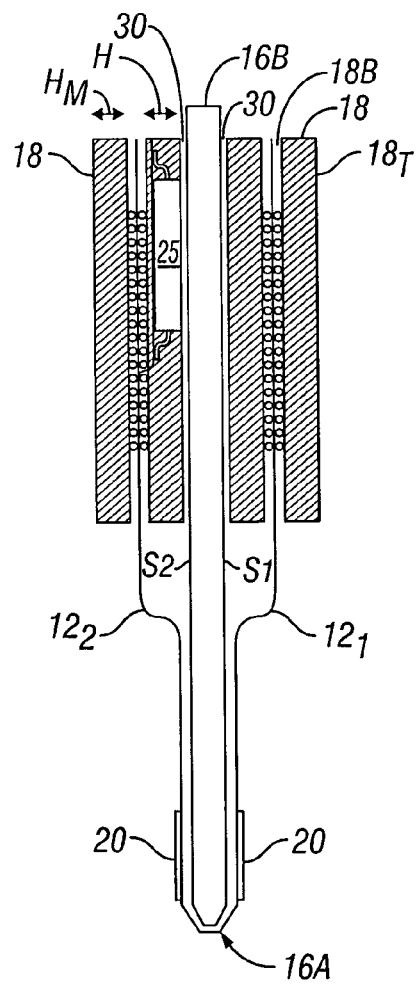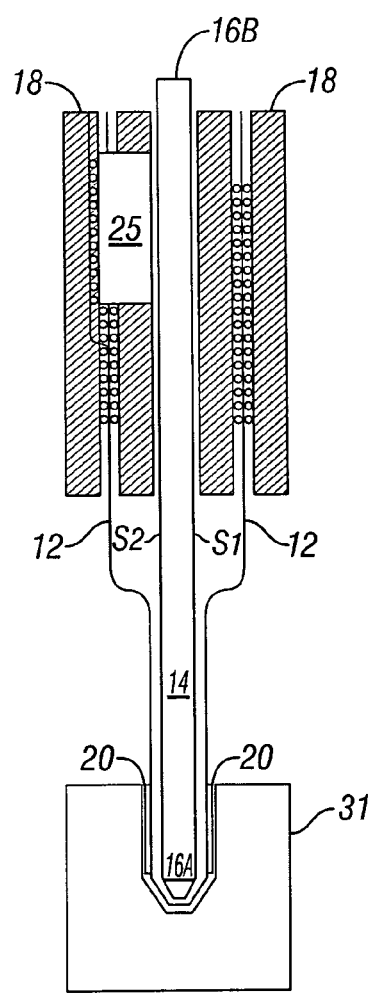
*FIG. 3*  *FIG. 4*

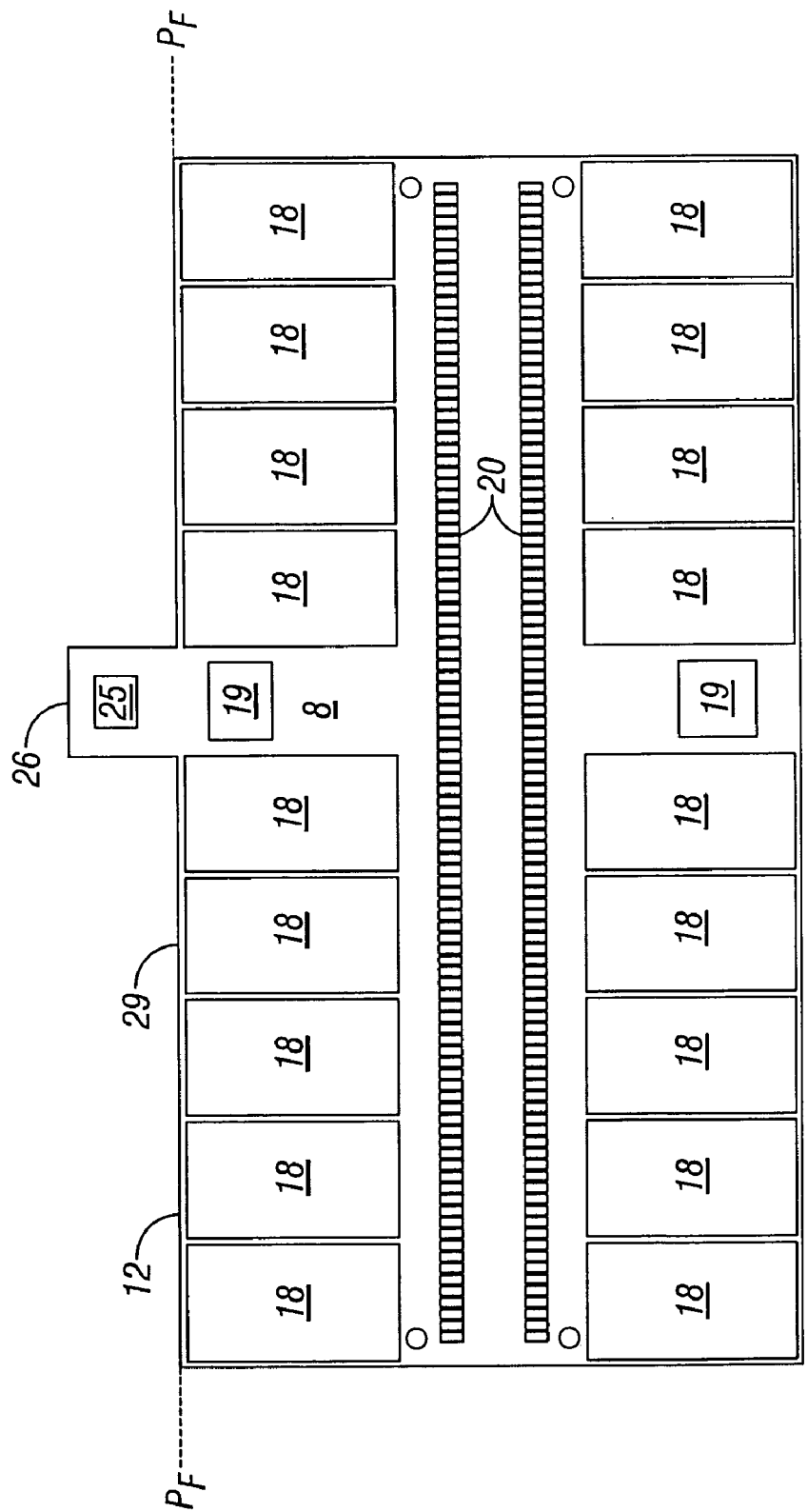

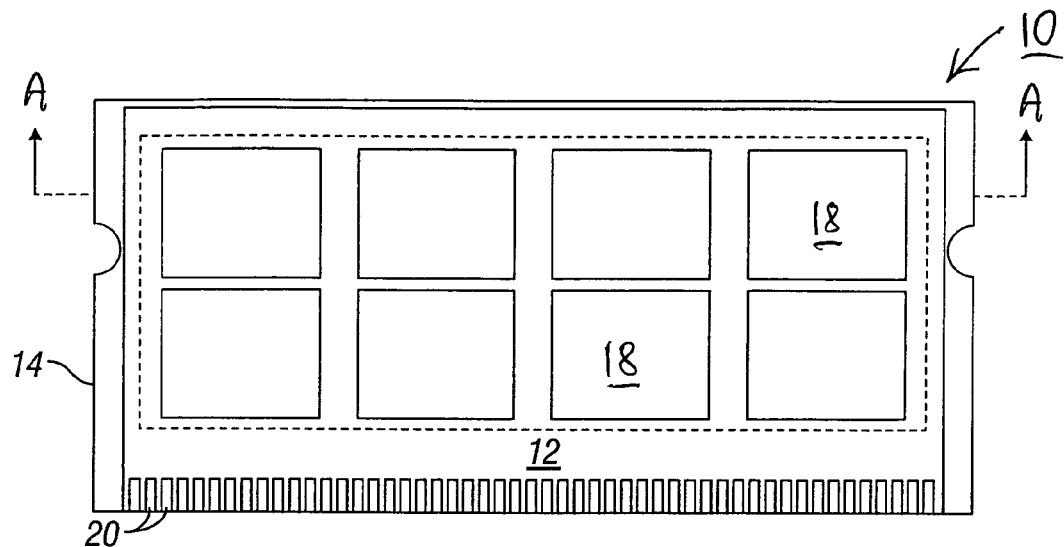
FIG. 7
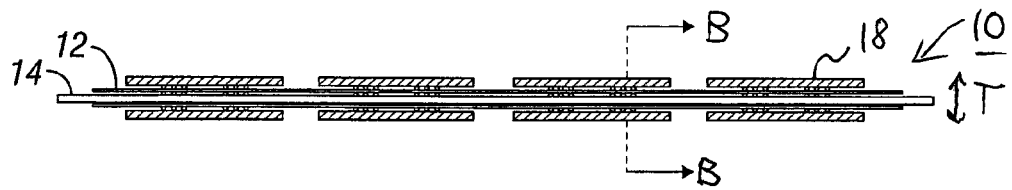
FIG. 8
FIG. 9
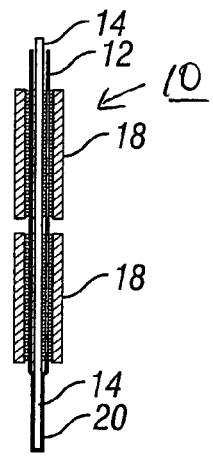 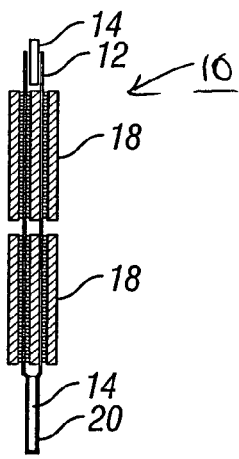
FIG. 10  FIG. 11

MEMORY MODULE SYSTEM AND METHOD

RELATED APPLICATIONS

This application is a continuation-in-part of U.S. patent application Ser. No. 10/934,027, filed Sep. 3, 2004; is a continuation-in-part of U.S. patent application Ser. No. 11/005,992, filed Dec. 7, 2004; and is a continuation-in-part of U.S. patent application Ser. No. 11/007,551, filed Dec. 8, 2004. The entirety of each of the above identified patent applications is hereby incorporated by reference.

FIELD

The present invention relates to systems and methods for creating high density circuit modules.

BACKGROUND

The well-known DIMM (Dual In-line Memory Module) board has been used for years, in various forms, to provide memory expansion. A typical DIMM includes a conventional PCB (printed circuit board) with memory devices and supporting digital logic devices mounted on both sides. The DIMM is typically mounted in the host computer system by inserting a contact-bearing edge of the DIMM into a card edge connector. Systems that employ DIMMs provide limited space for such devices and conventional DIMM-based solutions have typically provided only a moderate amount of memory expansion.

As die sizes increase, the limited surface area available on conventional DIMMs limits the number of devices that may be carried on a memory expansion module devised according to conventional DIMM techniques. Further, as bus speeds have increased, fewer devices per channel can be reliably addressed with a DIMM-based solution. For example, 288 ICs or devices per channel may be addressed using the SDRAM-100 bus protocol with an unbuffered DIMM. Using the DDR-200 bus protocol, approximately 144 devices may be addressed per channel. With the DDR2-400 bus protocol, only 72 devices per channel may be addressed. This constraint has led to the development of the fully-buffered DIMM (FB-DIMM) with buffered C/A and data in which 288 devices per channel may be addressed. With the FB-DIMM, not only has capacity increased, pin count has declined to approximately 69 from the approximately 240 pins previously required.

The FB-DIMM circuit solution is expected to offer practical motherboard memory capacities of up to about 192 gigabytes with six channels and eight DIMMs per channel and two ranks per DIMM using one gigabyte DRAMs. This solution should also be adaptable to next generation technologies and should exhibit significant downward compatibility.

This great improvement has, however, come with some cost and will eventually be self-limiting. The basic principle of systems that employ FB-DIMM relies upon a point-to-point or serial addressing scheme rather than the parallel multi-drop interface that dictates non-buffered DIMM addressing. That is, one DIMM is in point-to-point relationship with the memory controller and each DIMM is in point-to-point relationship with adjacent DIMMs. Consequently, as bus speeds increase, the number of DIMMs on a bus will decline as the discontinuities caused by the chain of point-to-point connections from the controller to the "last" DIMM become magnified in effect as speeds increase. Consequently, methods to increase the capacity of a single DIMM find value in contemporary memory and computing systems.

There are several known methods to improve the limited capacity of a DIMM or other circuit board. In one strategy, for example, small circuit boards (daughter cards) are connected to the DIMM to provide extra mounting space. The additional connection may cause, however, flawed signal integrity for the data signals passing from the DIMM to the daughter card while the additional thickness of the daughter card(s) increases the profile of the DIMM.

Multiple die packages (MDP) are also used to increase DIMM capacity while preserving profile conformity. This scheme increases the capacity of the memory devices on the DIMM by including multiple semiconductor die in a single device package. The additional heat generated by the multiple die typically requires, however, additional cooling capabilities to operate at maximum operating speed. Further, the MDP scheme may exhibit increased costs because of increased yield loss from packaging together multiple die that are not fully pre-tested.

Stacked packages or "stacks" are yet another strategy used to increase circuit board capacity. This scheme increases capacity by stacking packaged integrated circuits to create a stacked high-density circuit module for mounting on the circuit board. In some techniques, flexible conductors are used to selectively interconnect packaged integrated circuits in such stacks.

Staktek Group LP has developed multiple innovations in memory module design and applications including stacks and larger modules. Some designs aggregate several packaged ICs on plug-in modules that replace conventional DIMMs (including, for example, fully buffered, registered or simple DIMM designs).

As signal management is brought on-board and capacities and consequent thermal issues multiply, circuits other than memory are increasingly included in memory modules. The use of other circuitry that may exhibit a profile or dimensionality that differs from that of the memory circuits can increase manufacturing complexity. Consequently, what is needed are methods and systems to adapt flex circuit-based memory modules to more readily incorporate integrated circuit packages of a variety of sizes and dimensions.

SUMMARY

Memory module flex circuitry is devised to accommodate packaged integrated circuit devices (ICs) of varying heights or thicknesses. The invention may be employed to advantage in a variety of modules that employ flex circuitry including, but not limited to, fully-buffered, registered or more simple memory modules. Many such modules may replace conventionally-constructed DIMMs without change to the system in which the module is employed.

Regions of the flex circuitry devised to provide one or more mounting locales for ICs are delineated or separated, in part, from the main body of the flex circuit. The delineation or separation may be implemented in a preferred embodiment by separating a designated IC mounting area or peninsula from the main body of the flex circuitry either with isolating areas or separations or with tabs that extend from the primary perimeter of the flex circuitry.

BRIEF DESCRIPTION OF THE DRAWINGS

FIG. 3 is a cross-sectional depiction through certain devices of a module constructed in accordance with a preferred embodiment of the present invention.

FIG. 4 is a cross-sectional depiction through certain devices of a module constructed in accordance with a preferred embodiment of the present invention.

FIG. 5 depicts a flex circuit devised in accordance with another preferred embodiment of the present invention.

FIG. 7 depicts an alternative embodiment in accordance with the invention.

FIGS. 8 and 9 depict cross-sectional views of alternative embodiments in accordance with the present invention taken along line A of FIG. 7.

FIGS. 10 and 11 depict cross-sectional views of alternative embodiments in accord with the present invention taken along line B of FIG. 8.

DETAILED DESCRIPTION OF PREFERRED EMBODIMENTS

Figure 1:
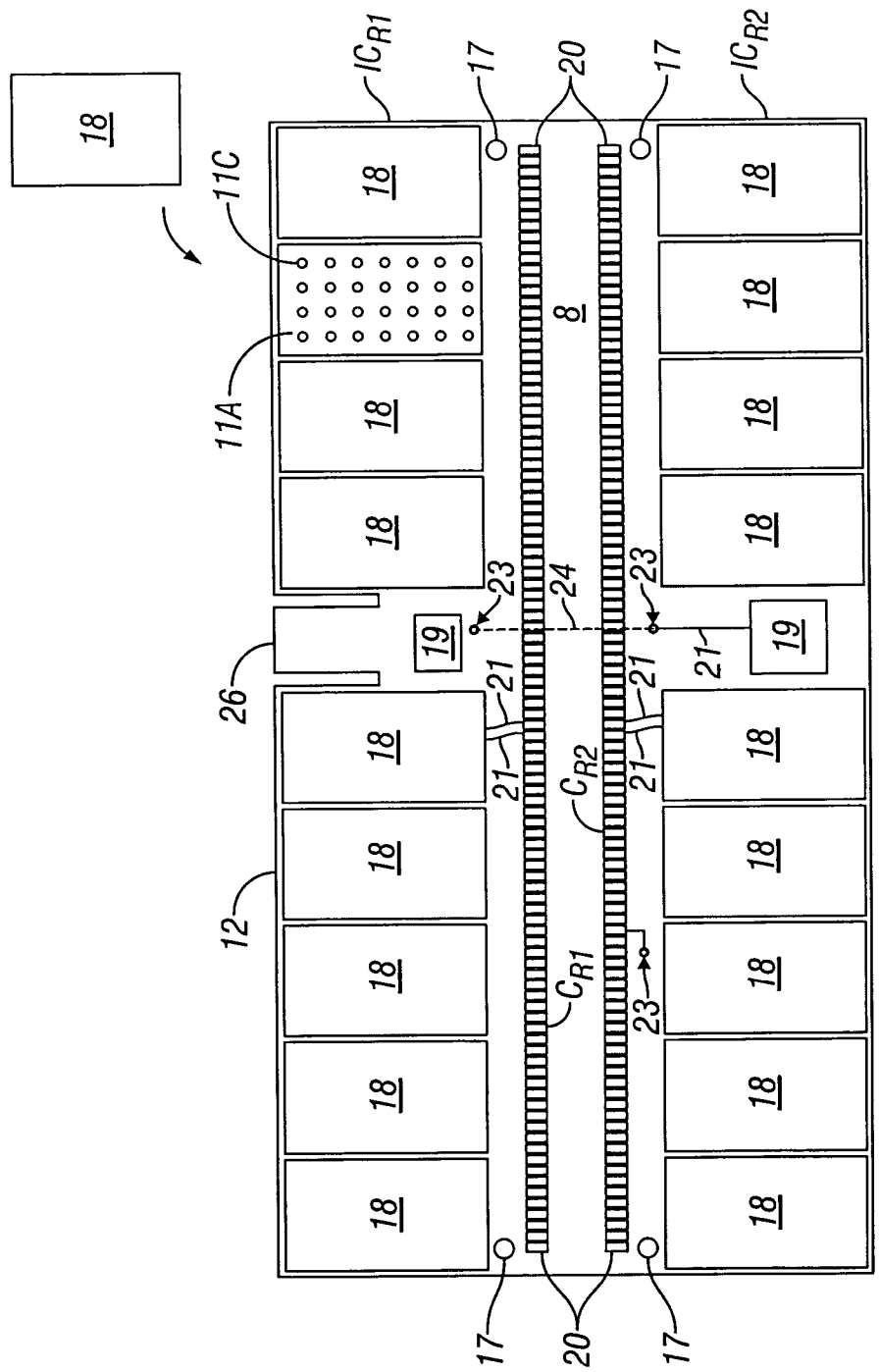
FIG. 1 is a depiction of a first side of a flex circuit devised in accordance with a preferred embodiment of the present invention.
Figure 2:
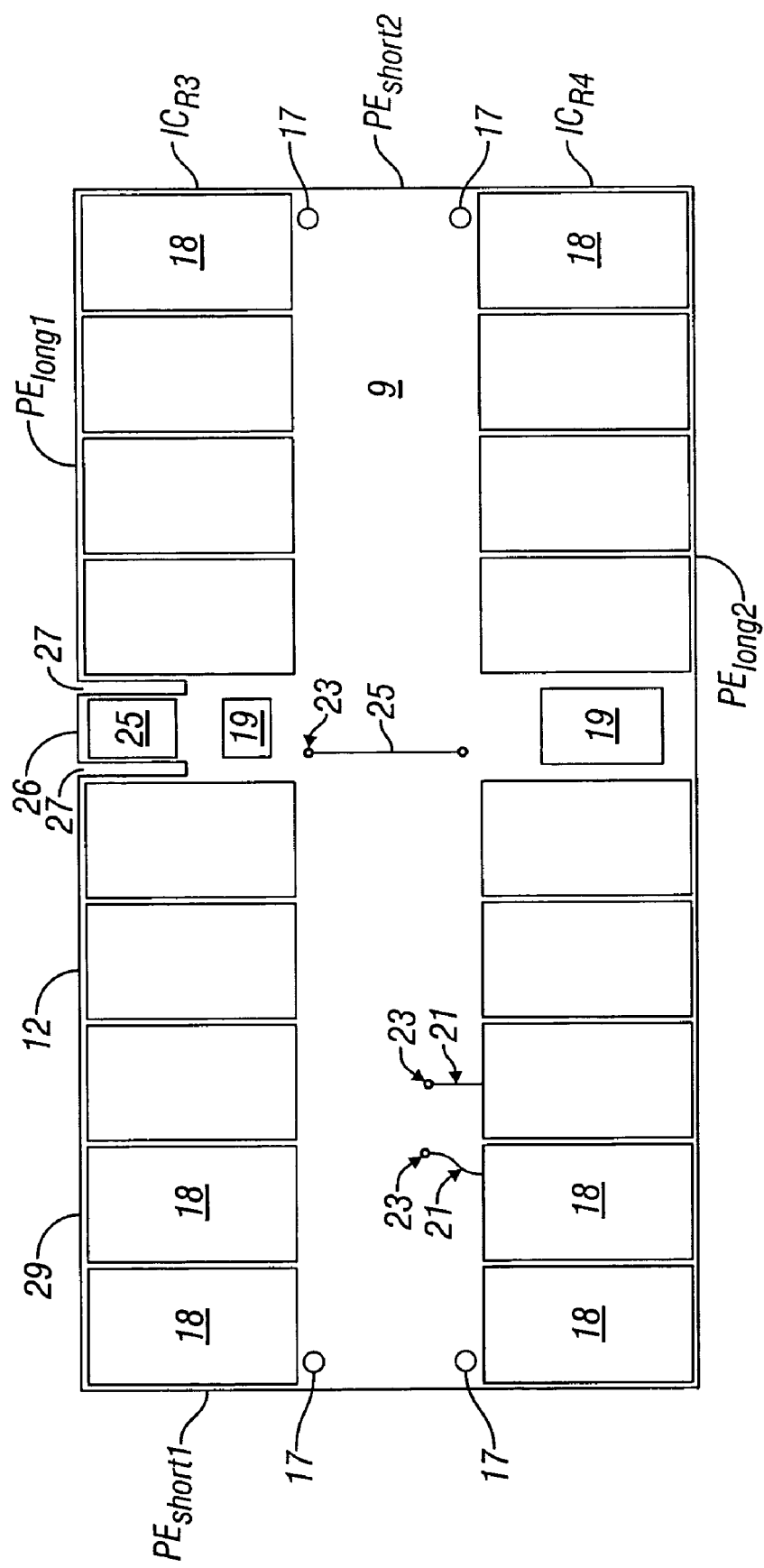
FIG. 2 depicts a second side of a flex circuit that may be employed in a memory module in accordance with a preferred embodiment of the present invention.

FIGS. 1 and 2 depict opposing sides 8 and 9, respectively, of a preferred flex circuit 12 ("flex", "flex circuitry", "flexible circuit") used in constructing a module according to a preferred embodiment of the present invention. Flex circuit 12 is preferably made from one or more conductive layers supported by one or more flexible substrate layers as described with further detail in U.S. patent application Ser. No. 10/934,027 which has been incorporated by reference and which application is owned by the assignee of the present invention. The entirety of the flex circuit 12 may be flexible or, as those of skill in the art will recognize, the flexible circuit 12 may be made flexible in certain areas to allow conformability to required shapes or bends, and rigid in other areas to provide rigid and planar mounting surfaces. Preferred flex circuit 12 has openings 17 for use in aligning flex circuit 12 to substrate 14 during assembly.

ICs 18 on flexible circuit 12 are, in the depicted embodiment, chip-scale packaged memory devices. For purposes of this disclosure, the term chip-scale or "CSP" shall refer to integrated circuitry of any function with an array package providing connection to one or more die through contacts (often embodied as "bumps" or "balls" for example) distributed across a major surface of the package or die. CSP does not refer to leaded devices that provide connection to an integrated circuit within the package through leads emergent from at least one side of the periphery of the package such as, for example, a TSOP.

Embodiments of the present invention may be employed with leaded or CSP devices or other devices in both packaged and unpackaged forms but where the term CSP is used, the above definition for CSP should be adopted. Consequently, although CSP excludes leaded devices, references to CSP are to be broadly construed to include the large variety of array devices (and not to be limited to memory only) and whether die-sized or other size such as BGA and micro BGA as well as flip-chip. As those of skill will understand after appreciating this disclosure, some embodiments of the present invention may be devised to employ stacks of ICs each disposed where an IC 18 is indicated in the exemplar Figs.

Multiple integrated circuit die may be included in a package depicted as a single IC 18. While in this embodiment memory ICs are used to provide a memory expansion board or module, various embodiments may include a variety of integrated circuits and other components. Such variety may include microprocessors, FPGA's, RF transceiver circuitry, and digital logic, as a list of non-limiting examples, or other circuits or systems which may benefit from a high-density circuit board or module capability. Thus the depicted multiple instances of IC 18 may be devices of a first primary function or type such as, for example, memory, while other devices such as depicted circuit 25, for example, or circuit 19 may be devices of a second primary function or type such as, for example, thermal sensing in which the circuit generates a signal which may be employed to calculate the heat accumulation or temperature of a module. Circuit 19 depicted on FIGS. 1 and 2 may be a memory buffer or controller and, in a fully-buffered module, it may also be considered a representation of the well known advanced memory buffer or "AMB", although its representation scale is merely exemplar and should not be considered literal.

Depicted circuit 25 shown on FIG. 2 is mounted on mounting peninsula or peninsular mounting area 26 of flex circuit 12. Peninsula or peninsular mounting area 26 is separate, in part, from main body 29 of flex circuit 12 and, in this case, that separation is effectuated by separations 27. In this embodiment, peninsular mounting area 26 is within the perimeter edge of main body 29 but other embodiments may exhibit a peninsular mounting area that extends beyond a perimeter edge of main body 29 as will be shown in the exemplar embodiment depicted in later FIG. 5.

Separations 27 give peninsula 26 freedom of movement that will be shown in later Figs. to provide flexibility in positioning integrated circuit (IC) 25 particularly when IC 25 exhibits a profile or thickness that varies from that exhibited by ICs 18.

FIG. 1 depicts a top or outer side 8 of flex circuit 12 having ICs 18 mounted in two rows $IC_{R1}$ and $IC_{R2}$. Contact arrays are disposed beneath ICs 18 and circuits 19 and 25 to provide conductive pads for interconnection to the ICs. An exemplar contact array 11A is shown as is exemplar IC 18 to be mounted at contact array 11A as depicted. The contact arrays 11A that correspond to an IC plurality such as $IC_{R1}$ and $IC_{R2}$ may be considered a contact array set.

Between the rows $IC_{R1}$ and $IC_{R2}$ of ICs 18, flex circuit 12 has two rows (CR1 and CR2) of module contacts 20. These contacts are adapted for insertion in a circuit board socket such as in a preferred embodiment, an expansion board edge connector. When flex circuit 12 is folded as depicted in later Figs., side 8 depicted in FIG. 1 is presented at the outside of module 10. The opposing side 9 of flex circuit 12 (FIG. 2) is on the inside in the folded configurations of FIGS. 3 and 4, for example. Other embodiments may have other numbers of contacts arranged in one or more rows or otherwise and there may be only one such row of contacts. Those of skill will recognize that the identified pluralities of CSPs (i.e, $IC_{R1}$ and $IC_{R2}$) when disposed in the configurations depicted, are typically described as "ranks".

Side 9 of flex circuit 12 is on the inside in several depicted configurations of module 10 and thus side 9 is closer to substrate 14 about which flex circuit 12 is disposed than is side 8. Other embodiments may have other numbers of ranks and combinations of plural CSPs connected to create the module of the present invention. In particular, some embodiments may be configured to supplant conventional fully-buffered DIMMs as disclosed in detail in co-pending U.S. patent application Ser. No. 11/007,551, filed Dec. 8, 2004 which has been incorporated by reference.

Various discrete components such as termination resistors, bypass capacitors, and bias resistors, in addition to the circuits 19 shown on sides 8 and 9 of flex circuit 12 as well as circuit 25 may be mounted on either or both sides 8 and 9 of flex 12. In the depicted embodiment, however, circuit 25 is depicted on side 9 which will be on the inner side of module 10. In the depicted embodiment, circuit 25 represents a thermal sensor to indicate the temperatures exhibited by the module and, consequently, circuit 25 is placed closer to the substrate by mounting it on what will be the inner side of flex circuit 12 when flex 12 is assembled with the module.

Flex circuit 12 may also depicted with reference to the perimeter edges of its main body 29, two of which perimeter edges are typically long ($PE_{long1}$ and $PE_{long\ 2}$) and two of which are typically shorter ($PE_{short1}$ and $PE_{short2}$). Other embodiments may employ flex circuits 12 that are not rectangular in shape and may be square in which case the perimeter edges would be of equal size or other convenient shape to adapt to manufacturing particulars. Rectangular shapes for flex circuit 12 assist, however, in providing a low profile for a preferred module devised with use of flex circuit 12.

FIG. 1 depicts an exemplar conductive trace 21 connecting rows CR1 and $C_{R2}$ of module contacts 20 to ICs 18. Those of skill will understand that there are many such traces in a typical embodiment. Traces 21 may also connect to vias that may transit to other conductive layers of flex 12 in certain embodiments having more than one conductive layer. Also shown are exemplar vias 23 connecting a signal trace 21 from circuit 19 to a trace 24 disposed on another conductive layer of flex 12 as illustrated by the dotted line of trace 24. In a preferred embodiment, vias connect ICs 18 on side 9 of flex 12 to module contacts 20. Traces may make other connections between the ICs on either side of flex 12 and may traverse the rows of module contacts 20 to interconnect ICs. Together the various traces and vias make interconnections needed to convey data and control signals amongst the various ICs and buffer circuits. Those of skill will understand that amongst other embodiments, the present invention may be implemented as a module bearing ICs on only one side of flex circuit 12.

FIG. 3 is a cross section view of a module 10 devised in accordance with a preferred embodiment of the present invention. Module 10 is populated with ICs 18 having top surfaces $18_T$ and bottom surfaces $18_B$. Substrate or support structure 14 has first and second perimeter edges 16A and 16B appearing in the depiction of FIG. 3 as ends. Substrate or support structure 14 typically has first and second lateral sides $S_1$ and $S_2$. Flex 12 is wrapped about or passed about perimeter edge 16A of substrate 14, which in the depicted embodiment, provides the basic shape of a common DIMM form factor such as that defined by JEDEC standard MO-256. That places a first part (121) of flex circuit 12 proximal to side $S_1$ of substrate 14 and a second part (122) of flex circuit 12 proximal to side $S_2$ of substrate 14.

In both FIGS. 3 and 4, the pair of ICs 18 depicted on the S2side of substrate 14 are shown with less pronounced lines to illustrate that the cross-section is taken along a plane that intersects IC 25 rather than ICs 18 on the S2side of substrate 14. In FIGS. 3 and 4, IC 25 is shown as having a thickness, profile, or height "H" which, in the case of the embodiment of FIG. 3 is less than thickness, profile, or height $H_M$ of ICs 18 and is greater than $H_M$ in the embodiment of FIG. 4. Those of skill will recognize that IC 25 is representative of any of a variety of ICs that exhibit a profile that is different from that exhibited by ICs 18 and need not be a thermal sensor. Just as ICs 18 that are proximal to substrate 14 may preferably be attached to substrate 14 with an adhesive attachment of their respective upper sides, so too may IC 25 be attached to substrate 14 with an adhesive such as that depicted by reference 30. While in this embodiment, the four depicted ICs are attached to flex circuit 12 in opposing pairs, this is not limiting and more ICs may be connected in other arrangements such as, for example, staggered or offset arrangements, examples of which may be found in U.S. patent application Ser. No. 10/934,027 filed Sep. 3, 2004 and U.S. patent application Ser. No. 11/005,992 filed Dec. 7, 2004, both of which have been incorporated by reference.

In the embodiments depicted in FIGS. 3 and 4, flex circuit 12 has module contacts 20 positioned in a manner devised to fit in a circuit board card edge connector or socket such as edge connector 31 shown in FIG. 4 and connect to corresponding contacts in the connector (not shown). As those of skill will recognize, edge connector 31 may be a part of a variety of other devices such as general purpose computers and notebooks. While module contacts 20 are shown protruding from the surface of flex circuit 12, this is not limiting and other embodiments may have flush contacts or contacts below the surface level of flex 12. Substrate 14 supports module contacts 20 from behind flex circuit 12 in a manner devised to provide the mechanical form required for insertion into a socket. While the depicted substrate 14 has uniform thickness, this is not limiting and in other embodiments the thickness or surface of substrate 14 may vary in a variety of ways such as shown, for example in U.S. patent application Ser. No. 10/934,027, filed Sep. 3, 2004; U.S. patent application Ser. No. 11/005,992, filed Dec. 7, 2004; and U.S. patent application Ser. No. 11/007,551, filed Dec. 8, 2004. Further, in the vicinity of perimeter edge 16A or the vicinity of perimeter edge 16B the shape of substrate 14 may also differ from a uniform taper. Non-limiting examples of such possible variations are found in U.S. patent application Ser. No. 10/934,027, filed Sep. 3, 2004 which is owned by the assignee of the present invention and has been incorporated herein by reference. Substrate 14 in the depicted embodiment is preferably made of a metal such as aluminum or copper, as non-limiting examples, or where thermal management is less of an issue, materials such as FR4 (flame retardant type 4) epoxy laminate, PTFE (poly-tetra-fluoro-ethylene) or plastic. In another embodiment, advantageous features from multiple technologies may be combined with use of FR4 having a layer of copper on both sides to provide a substrate 14 devised from familiar materials which may provide heat conduction or a ground plane.

One advantageous methodology for efficiently assembling a circuit module 10 such as described and depicted herein is as follows. In a preferred method of assembling a preferred module assembly 10, a flex circuit 12 is provided with one or more mounting peninsulas that have been delineated from the body of flex circuit 12. That flex circuit 12 is laid flat and one or both sides are populated according to circuit board assembly techniques known in the art. Flex circuit 12 is then folded about end 16A of substrate 14. Next, optionally, tooling holes 17 may be used to align flex 12 to substrate 14. Flex 12 may be laminated or otherwise attached to substrate 14 at portions 24. Further, top surfaces 18T of ICs 18 and the top surface of circuit 25 may be attached to substrate 14 in a manner devised to provide mechanical integrity or thermal conduction.

The depicted adhesive 30 and flex 12 may vary in thickness and are not drawn to scale to simplify the drawing. The depicted substrate 14 has a thickness such that when assembled with the flex 12 and adhesive 30, the thickness measured between module contacts 20 falls in the range specified for the mating connector. In some other embodiments, flex circuit 12 may be wrapped about perimeter edge 16B or both perimeter edges 16A and 16B of substrate 14. In other instances, multiple flex circuits may be employed or a single flex circuit may connect one or both sets of contacts 20 to the resident ICs. A variety of representative embodiments of module 10 that may employ the inventions disclosed herein can be found in U.S. patent application Ser. No. 10/934,027, filed Sep. 3, 2004; U.S. patent application Ser. No. 11/005, 992, filed Dec. 7, 2004; and U.S. patent application Ser. No. 11/007,551, filed Dec. 8, 2004 all of which are owned by the assignee of the present invention and are each incorporated by reference into this application.

Figure 6:
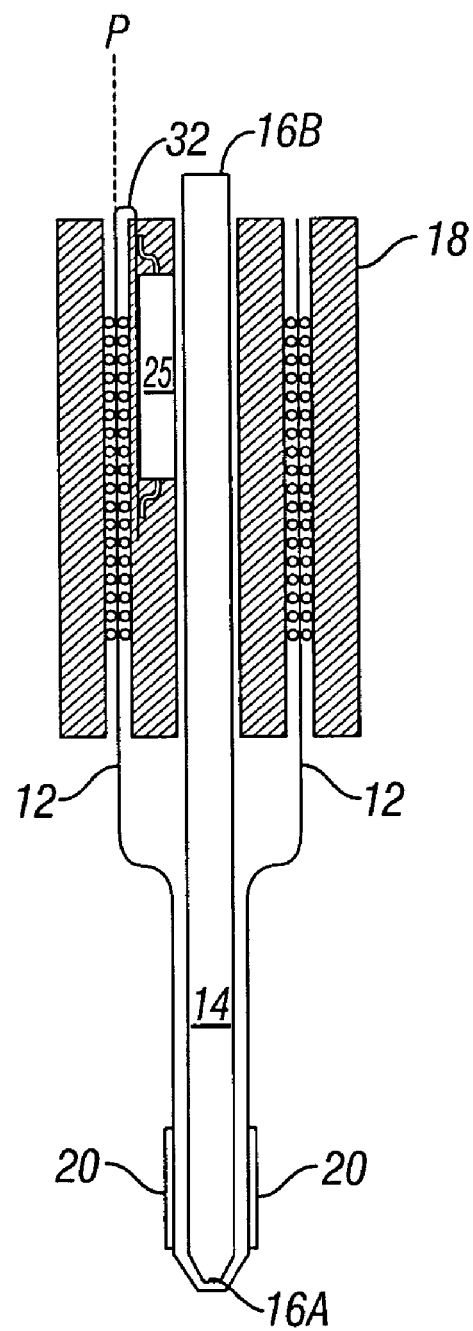
FIG. 6 depicts a memory module devised in accordance with another preferred embodiment of the present invention.

FIG. 5 depicts side 8 of a flex circuit 12 and illustrates peninsula 26 devised as an outcropping from main body 29 of flex circuit 12. Peninsular mounting area 26 extends beyond a perimeter line of main body 29 of flex circuit 12. Perimeter line of main body 29 is identified by line "$P_F$" shown in FIG. 5. Peninsula or peninsular mounting area 26 bears IC 25. FIG. 6 depicts an exemplar module 10 as may be assembled using flex circuit 12 devised as illustrated in FIG. 5.

As shown in the embodiment depicted in FIG. 6, on side S2 of substrate 14, flex circuit 12 extends generally along a plane "P" that lies between two ICs 18 on the S2 side of substrate 14. As shown, flex circuit 12 is arced over at arc, bend, or directional reversal point 32 on the S2side of substrate 14 to place peninsula 26 on the S2side of substrate 14 but more proximal to substrate 14 than is the main body 29 of flex circuit 12 on that side of substrate 14. This allows circuit 25 to be disposed so that it may be placed as close to substrate 14 as desired including in contact with substrate 14.

FIG. 7 depicts an alternative embodiment in accordance with the invention. Module 10 may be connected so that one-half of the flex circuit 12 supports one-half of the data bits. Each half of flex circuit 12 has two sets of three rows of four CSPs 18 each. The resulting module 10 has a thickness "T" shown in FIG. 8 which is 3× the thickness of a CSP 18 plus 2× the thickness of flex circuit 12. This arrangement provides several combinations of one-half of the data bits as those of skill will recognize after appreciating this specification.

FIGS. 8 and 9 depict cross-sectional views of alternative embodiments in accordance with the present invention taken along line A of FIG. 7.

FIGS. 10 and 11 depict cross-sectional views of alternative embodiments in accord with the present invention taken along line B of FIG. 8.

The present invention may be employed to advantage in a variety of applications and environment such as, for example, in computers such as servers and notebook computers by being placed in motherboard expansion slots to provide enhanced memory capacity while utilizing fewer sockets. Two high rank embodiments or single rank high embodiments may both be employed to such advantage as those of skill will recognize after appreciating this specification as well as the U.S. patent applications that have been incorporated herein by reference.

Although the present invention has been described in detail, it will be apparent to those skilled in the art that many embodiments taking a variety of specific forms and reflecting changes, substitutions and alterations can be made without departing from the spirit and scope of the invention. Therefore, the described embodiments illustrate but do not restrict the scope of the claims.

The invention claimed is:

1. A circuit module comprised of:
    a flex circuit having a main body with first and second sides, said first side of the flex circuit having first and second sets of multiple circuit mounting areas on which are disposed integrated circuits of a first type which have a profile thickness of HM and the flex circuit exhibiting a perimeter defined by two opposing short sides (PEshort) and two opposing long sides (PElong) to manifest a configuration of approximately rectangular shape, the flex circuit having a peninsular area set off from the main body of the flex circuit by separations, said peninsular area not extending beyond the perimeter of the flex circuit and having on the first side of the flex circuit, a peninsular circuit mounting area having thereon disposed an integrated circuit of a second type having a profile thickness different than HM;
    a rigid substrate about which said flex circuit is folded to place both the integrated circuits of the first type disposed on the first and second multiple circuit mounting areas of the first side of the flex circuit adjacent to the rigid substrate and the integrated circuit of the second type mounted on the peninsular circuit mounting area.

2. The circuit module of claim 1 in which the integrated circuit of the second type has a profile thickness which is less than HM.

3. The circuit module of claim 1 in which the integrated circuit of the second type has a profile thickness which is greater than HM.

4. The circuit module of claim 1 in which the rigid substrate is comprised of metallic material.

5. The circuit module of claim 1 in which the integrated circuit of the second type is in contact with the rigid substrate.

6. The circuit module of claim 1 in which the integrated circuits of the first type are in contact with the rigid substrate.

7. The circuit module of claim 1 in which the integrated circuits of the first type are memory circuits.

8. The circuit module of claim 1 in which the integrated circuit of the second type is a control circuit.

9. The circuit module of claim 1 in which the integrated circuit of the second type is a buffer circuit.

* * * * *